(12) United States Patent
Gathman

(10) Patent No.: US 9,640,532 B2
(45) Date of Patent: May 2, 2017

(54) STACKED METAL OXIDE SEMICONDUCTOR (MOS) AND METAL OXIDE METAL (MOM) CAPACITOR ARCHITECTURE

(71) Applicant: QUALCOMM Incorporated, San Diego, CA (US)

(72) Inventor: Timothy Donald Gathman, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 60 days.

(21) Appl. No.: 14/476,086

(22) Filed: Sep. 3, 2014

(65) Prior Publication Data

US 2015/0236014 A1  Aug. 20, 2015

Related U.S. Application Data

(60) Provisional application No. 61/939,774, filed on Feb. 14, 2014.

(51) Int. Cl.
| | |
|---|---|
| *H01L 27/06* | (2006.01) |
| *H01L 27/08* | (2006.01) |
| *H01L 29/94* | (2006.01) |
| *H01L 29/93* | (2006.01) |
| *H03K 17/687* | (2006.01) |

(52) U.S. Cl.
CPC .......... *H01L 27/0808* (2013.01); *H01L 29/93* (2013.01); *H01L 29/94* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 6,104,257 A | 8/2000 | Mann | |
| 7,230,434 B1 | 6/2007 | Sasaki | |
| 7,335,956 B2 * | 2/2008 | Chen | H01L 23/5223 257/386 |
| 8,143,941 B2 | 3/2012 | Park et al. | |
| 8,169,014 B2 | 5/2012 | Chen et al. | |
| 8,207,567 B2 | 6/2012 | Chen et al. | |
| 8,614,472 B1 | 12/2013 | Islam et al. | |
| 2002/0060333 A1 | 5/2002 | Tanaka et al. | |

(Continued)

FOREIGN PATENT DOCUMENTS

| | | | |
|---|---|---|---|
| DE | 10139396 | * | 1/2003 |
| EP | 2383781 A1 | | 11/2011 |
| WO | 2015031200 | | 3/2015 |

OTHER PUBLICATIONS

Partial International Search Report—PCT/US2015/015339—ISA/EPO—May 28, 2015.

(Continued)

*Primary Examiner* — Ali Naraghi
(74) *Attorney, Agent, or Firm* — Smith Tempel Blaha LLC

(57) ABSTRACT

A device includes a first stacked capacitor comprising a first MOS capacitance and a first MOM capacitance, the first MOS capacitance coupled to a first node, the first node configured to receive a first bias voltage, and a second stacked capacitor comprising a second MOS capacitance and a second MOM capacitance, the second MOS capacitance coupled to the first node.

11 Claims, 12 Drawing Sheets

(56) References Cited

U.S. PATENT DOCUMENTS

| | | | |
|---|---|---|---|
| 2006/0024905 A1* | 2/2006 | He | H01L 23/5223 |
| | | | 438/396 |
| 2007/0181918 A1 | 8/2007 | Wada et al. | |
| 2008/0230820 A1 | 9/2008 | Maeda et al. | |
| 2011/0032660 A1* | 2/2011 | Dunn | H01G 4/1209 |
| | | | 361/313 |
| 2013/0026551 A1 | 1/2013 | Kim | |
| 2014/0017873 A1* | 1/2014 | Chang | H01L 23/481 |
| | | | 438/396 |
| 2015/0061071 A1 | 3/2015 | Vahid Far et al. | |
| 2015/0076924 A1* | 3/2015 | Kim | H03K 17/687 |
| | | | 307/115 |
| 2015/0084107 A1* | 3/2015 | Li | H01L 23/5223 |
| | | | 257/300 |

OTHER PUBLICATIONS

International Search Report and Written Opinion—PCT/US2015/015339—ISA/EPO—Sep. 16, 2015.

* cited by examiner

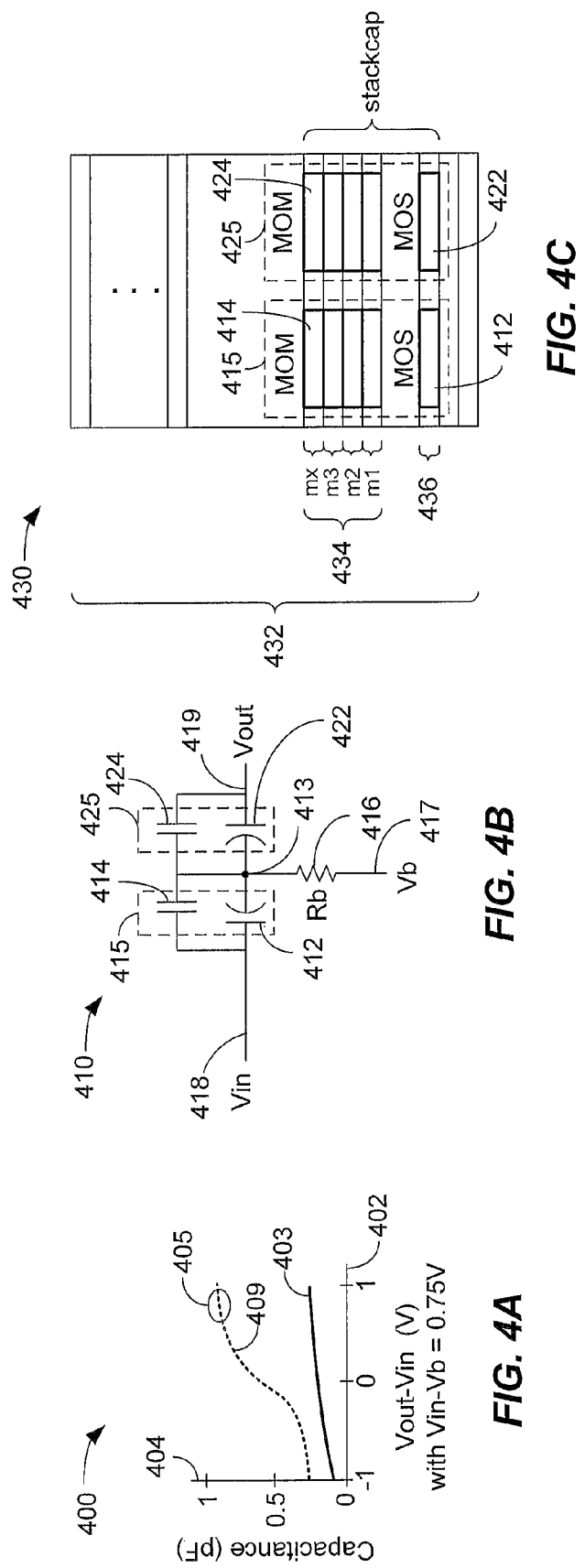

STACKED METAL OXIDE SEMICONDUCTOR (MOS) AND METAL OXIDE METAL (MOM) CAPACITOR ARCHITECTURE

RELATED APPLICATION

The present application claims priority to and the benefit of the filing date of U.S. Provisional Application No. 61/939,774, entitled "Stacked Metal Oxide Semiconductor (MOS) and Metal Oxide Metal (MOM) Capacitor Architecture" filed on Feb. 14, 2014, the entirety of which is incorporated into this document by reference.

BACKGROUND

Field

The present disclosure relates generally to electronics, and more specifically to the operation and design of stacked metal oxide semiconductor (MOS) and metal oxide metal (MOM) capacitors.

Background

Metal oxide semiconductor (MOS) capacitors and metal oxide metal (MOM) capacitors are used in many applications, such as in analog filters. A structure referred to as a stacked capacitor (stackcap) can comprise both MOS and MOM capacitors.

MOS capacitors, also may be referred to as metal oxide semiconductor varactors (MOSVARS) of either N- or P-type, having a capacitance which varies with applied voltage across their terminals. MOM capacitors comprise a dielectric, oxide, or insulating layer between two or more metal layers and include, but are not limited to, flux capacitors, fractal capacitors, parallel-plate capacitors, and woven capacitors.

MOS capacitors are generally more area efficient than MOM capacitors and therefore can be used in place of or in conjunction with MOM capacitors in a stackcap architecture to save circuit area. For example, the ratio of capacitance to area can be more than four times greater for a MOS capacitor than for a MOM capacitor. Unfortunately, MOS capacitors may exhibit non-linearity caused by capacitance variation with respect to voltage, the non-linearities of MOS capacitors being significantly greater than non-linearities exhibited by MOM capacitors.

Certain foundries and processes may allow vertical or other means of integration of both a MOS capacitor and MOM capacitor, allowing fabrication of the stackcap. A stackcap generally has a very dense architecture as it combines the area density of both the MOM capacitor and MOS capacitor and accordingly consumes a small amount of circuit area. Unfortunately, when used in high-density circuit applications, use of the stackcap may lead to non-linearities and may prevent a stackcap-only capacitor implementation, and may lead to the need for, or substitution of, additional MOM capacitance to achieve better linearity.

Therefore, a stacked MOS/MOM capacitance with improved linearity that minimizes circuit area is desirable.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

FIG. 4A is a graphical illustration showing the capacitance of a stackcap in accordance with exemplary techniques of the present disclosure.

FIG. 4B is a schematic diagram illustrating an exemplary embodiment of a stacked capacitor.

FIG. 4C is a schematic diagram showing an exemplary embodiment of the stacked capacitor of FIG. 4B.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

The terms "MOSCAP" and "MOS capacitance" refer to a capacitance formed using metal oxide semiconductor (MOS) technology.

The terms "MOM," "MOMCAP" and "MOM capacitance" refer to a capacitance formed using metal oxide metal (MOM) technology.

The terms "stacked capacitor" and "stackcap" refer to a MOM capacitance vertically integrated with a MOS capacitance on a wafer, laminate, or other multi-layer circuit structure.

Figure 1:
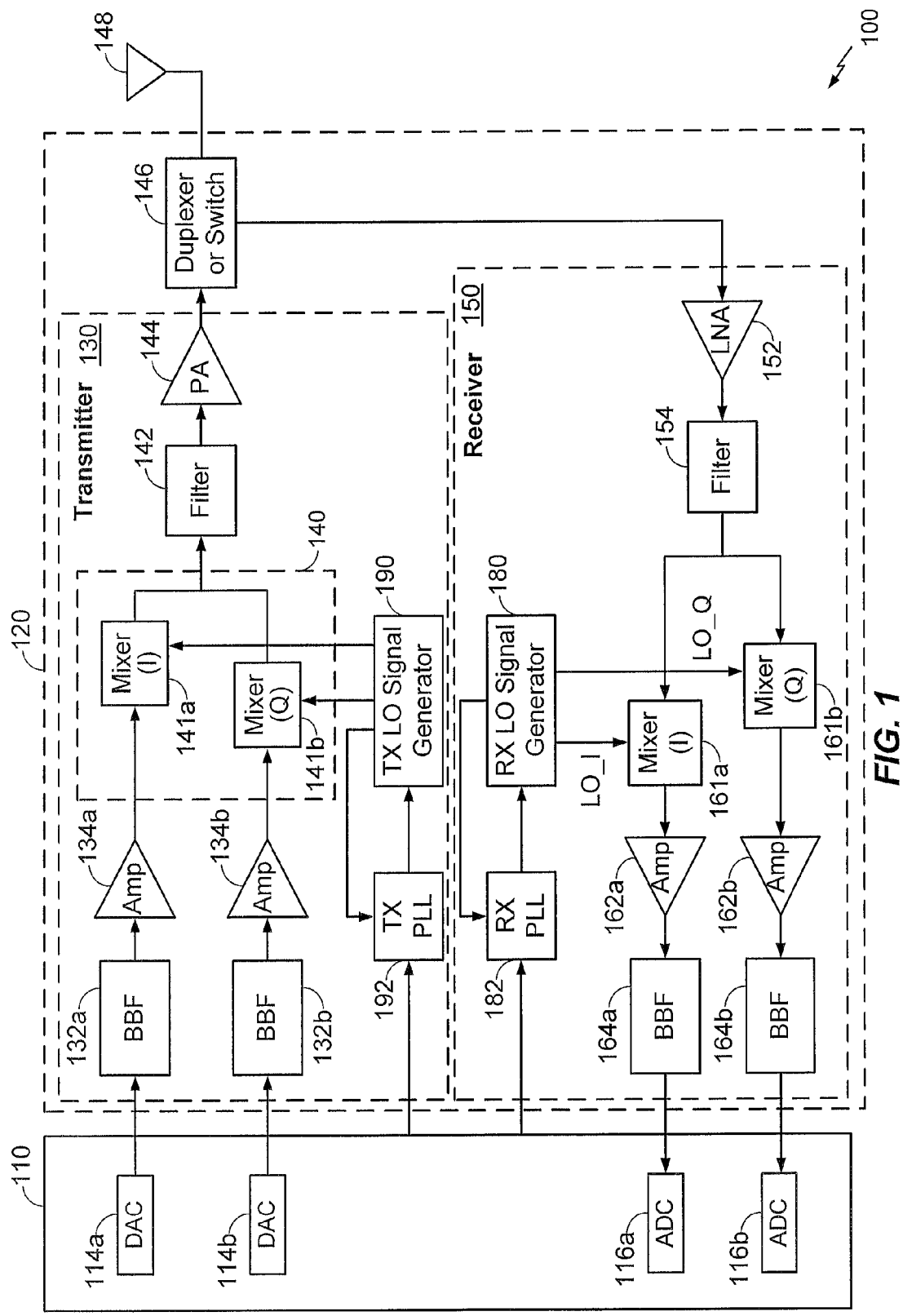
FIG. 1 is a diagram showing an exemplary embodiment of a wireless transceiver in which the techniques of the present disclosure may be implemented

FIG. 1 illustrates a block diagram of a design of a wireless communication device 100 in which exemplary the techniques of the present disclosure may be implemented. FIG. 1 shows an example transceiver design. In general, the conditioning of the signals in a transmitter 130 and a receiver 150 may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter 130 and receiver 150. Unless otherwise noted, any signal in FIG. 1, or any other figure in the drawings, may be either single-ended or differential. Some circuit blocks in FIG. 1 may also be omitted.

In the exemplary design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter 130 or a receiver 150 may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114a and 114b for converting digital signals generated by the data processor 110 into the I and Q analog output signals, e.g., I and Q output currents, for further processing.

Within transmitter 130, baseband filters 132a and 132b filter the I and Q analog output signals, respectively, to remove undesired images caused by the prior digital-to-analog conversion. Amplifiers (Amp) 134a and 134b amplify the signals from baseband filters 132a and 132b, respectively, and provide I and Q baseband signals. An upconverter 140 upconverts the I and Q baseband signals with I and Q transmit (TX) local oscillator (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The duplexer 146 is designed to operate with a specific RX-to-TX duplexer frequency separation, such that RX signals are isolated from TX signals. The received RF signal is amplified by LNA 152 and filtered by a filter 154 to obtain a desired RF input signal. Downconversion mixers 161a and 161b mix the output of filter 154 with I and Q receive (RX) LO signals (i.e., LO_I and LO_Q) from an RX LO signal generator 180 to generate I and Q baseband signals. The I and Q baseband signals are amplified by amplifiers 162a and 162b and further filtered by base-band filters 164a and 164b to obtain I and Q analog input signals, which are provided to data processor 110. In the exemplary embodiment shown, the data processor 110 includes analog-to-digital-converters (ADC's) 116a and 116b for converting the analog input signals into digital signals to be further processed by the data processor 110.

In FIG. 1, TX LO signal generator 190 generates the I and Q TX LO signals used for frequency upconversion, while RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

The transceiver 120 may be coupled to data processor 110 via a plurality of electrical interface pins (not necessarily explicitly shown in FIG. 1). For example, the outputs of base-band filters 164a, 164b, which may be differential in certain implementations, may be coupled to the inputs of ADC's 116a, 116b through a plurality of interface pins, e.g., two pins for each of filters 164a, 164b.

In state-of-the-art wireless devices, it would be desirable to reduce the package size of integrated circuits as well as board size to provide cost-effective solutions. Accordingly, it would be desirable to reduce the chip area of the capacitors used in the baseband filters and other analog low-pass filters in the transceiver 120 to reduce the overall package and die size, especially for IC's supporting multiple transmitter or receiver paths in a single die.

Figure 2:
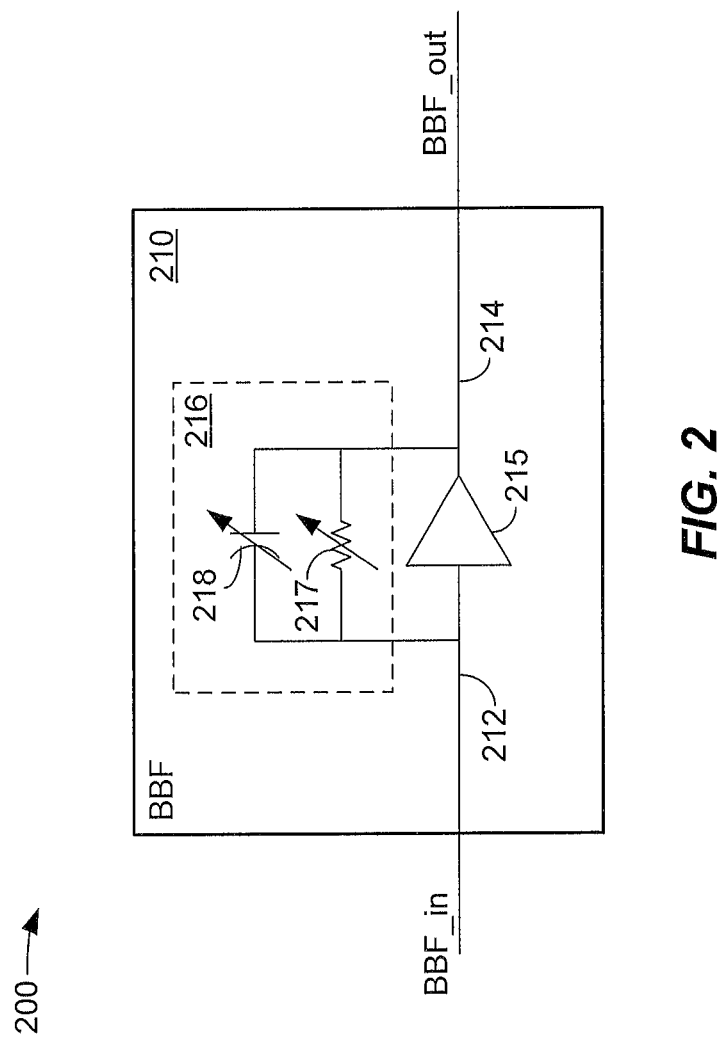
FIG. 2 is a schematic diagram illustrating an exemplary embodiment of a baseband filter that can be implemented using a stacked capacitor architecture.

FIG. 2 is a schematic diagram illustrating an exemplary embodiment of a baseband filter that can be implemented using a stacked capacitor architecture. The BBF 210 is a generic representation of one or more of the BBF instances shown in FIG. 1. The BBF 210 can comprise a filter element 215 configured to receive a baseband input signal (BBF_in) over connection 212 and provide a filtered baseband output signal (BBF_out) over connection 214. The filter element 215 can comprise an active or a passive filter circuit, such as, for example of an active filter circuit, an operational amplifier with feedback; and, for example of a passive filter circuit, only a resistive/capacitive network. A feedback network 216 is coupled between the output of the filter element 215 on connection 214 and the input to the filter element 215 on connection 212. The feedback network 216 can be implemented using any combination of capacitive, resistive, and/or inductive elements, and is illustrated herein using an adjustable resistance 217 and an adjustable capacitance 218 for exemplary purposes only. Exemplary embodiments of the stackcap architectures described herein can be used to implement the adjustable capacitance 218.

Figures 3A, 3B:
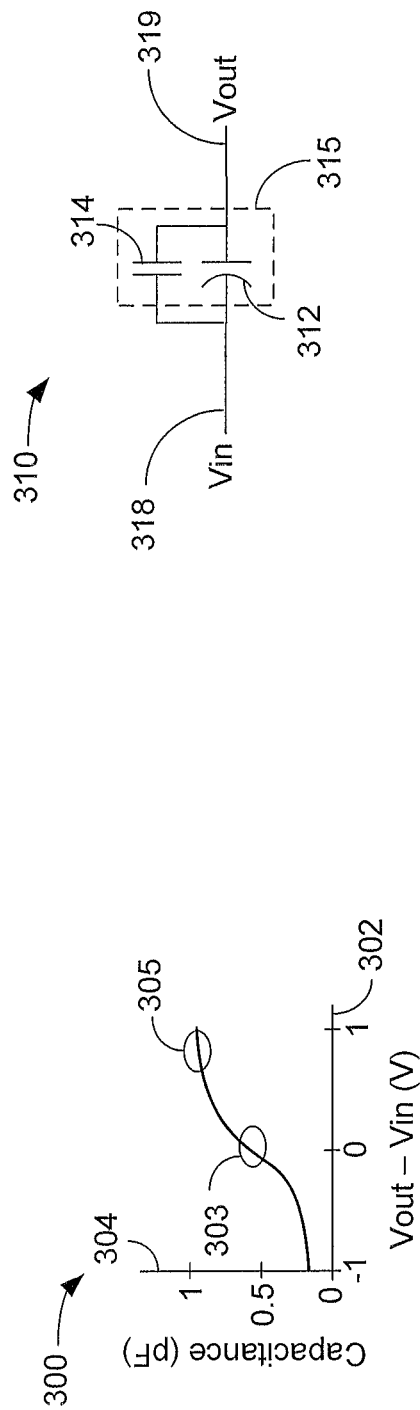
FIG. 3A is a graphical illustration showing the capacitance of a stackcap relative to voltage.
FIG. 3B is a schematic diagram illustrating an exemplary embodiment of a stacked capacitor.
Figure 3D:
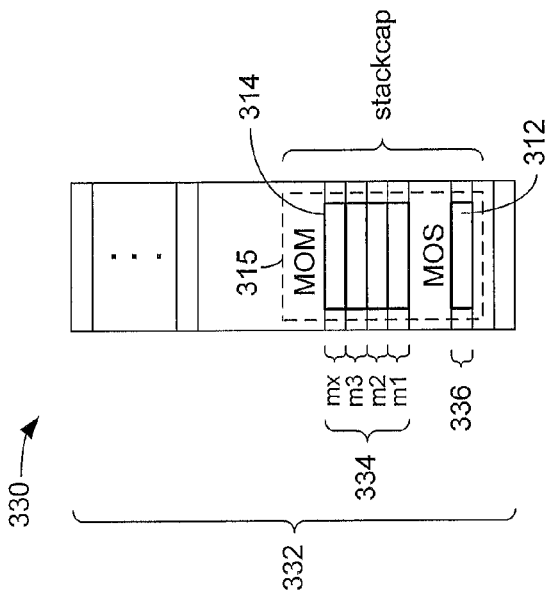
FIG. 3D is a two-dimensional side view showing an exemplary embodiment of the stackcap of FIGS. 3B and 3C.

FIG. 3A is a graphical illustration 300 showing the capacitance of a stackcap relative to voltage. In an exemplary embodiment, a stackcap may include one or more MOS capacitances implemented using one or more MOS varactors. A MOS varactor is a particular type of a MOS capacitance and generally comprises a MOS device with a first contact connected to the gate of the MOS device and a second set of contacts connecting the drain and source of the MOS device together, forming a MOS capacitance between the first and second contacts. In an exemplary embodiment, a MOS varactor operating in accumulation-mode is shown in FIG. 3E. Alternatively, a MOS varactor can be implemented using a PMOS capacitor structure in inversion-mode. A MOS varactor is known to those having ordinary skill in the art.

The horizontal axis 302 represents voltage and the vertical axis 304 represents capacitance. At 0V, the operation of a stackcap is quite non-linear. In the example shown in FIG. 3A, when unbiased, the region 303 shows the performance range of the stackcap with 0V bias. In the example shown in FIG. 3A, the region 305 shows the performance range of the stackcap with an approximate 1V bias voltage. As shown, the region 305 illustrates that the stackcap behaves more linearly with a bias voltage than it does with zero bias. In an exemplary embodiment, the capacitance and voltage performance shown in FIG. 3A represents an accumulation mode MOS varactor.

FIG. 3B is a schematic diagram 310 illustrating an exemplary embodiment of a stacked capacitor. In an exemplary embodiment, a MOS capacitor 312 is coupled in parallel with a MOM capacitor 314, which together form a stackcap 315. An input voltage, Vin, is provided over connection 318 and an output voltage, Vout, is provided over connection 319. Input and output connections are labeled in terms of voltage to demonstrate voltage dependence, although in a practical application, inputs and outputs could be either in terms of voltage or current.

Figure 3C:
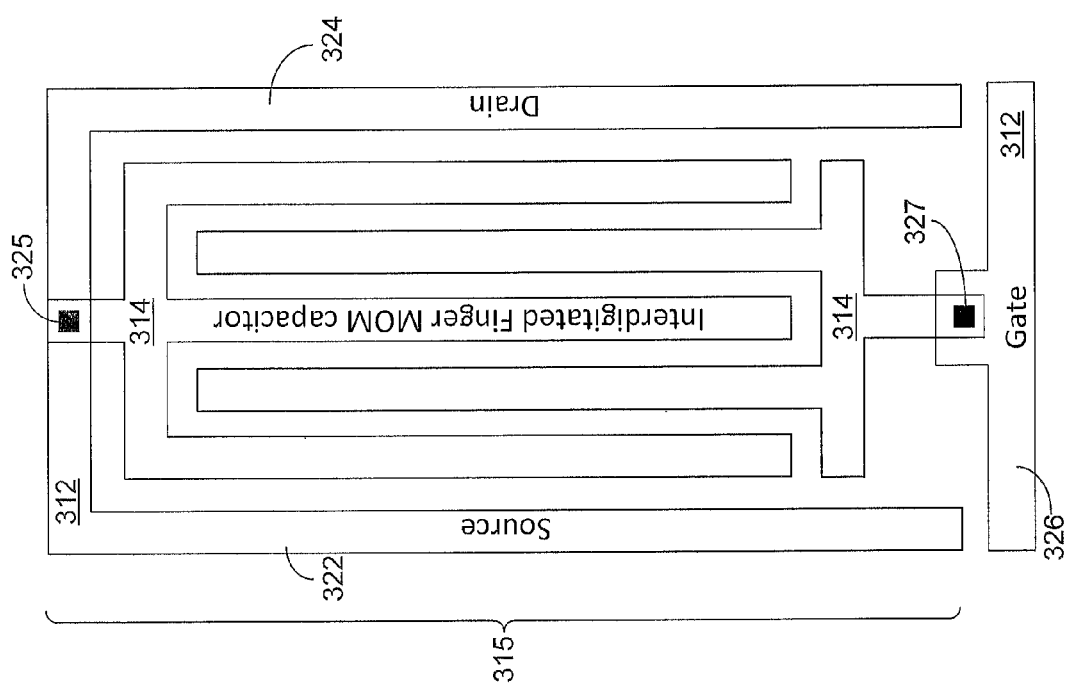
FIG. 3C is a diagram illustrating a two-dimensional plan view of a stackcap.
Figure 3E:
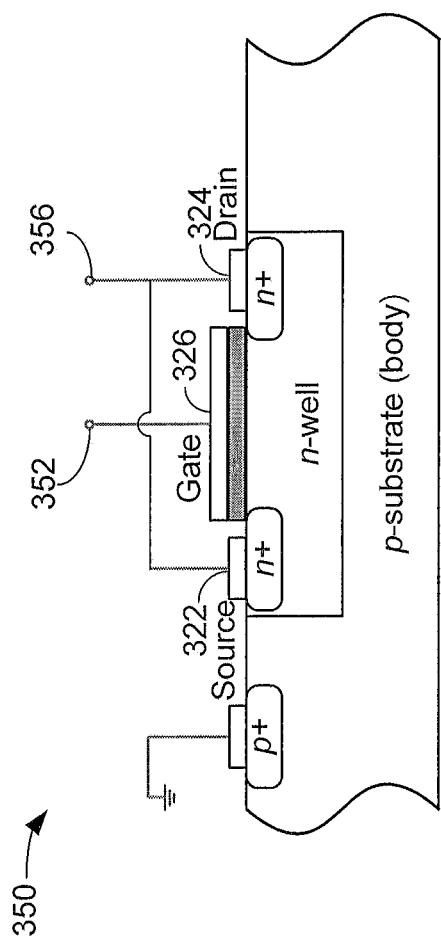
FIG. 3E is a schematic diagram illustrating an exemplary embodiment of a MOS varactor.

FIG. 3C is a diagram illustrating a two-dimensional plan view of a stackcap 315. The stackcap 315 comprises a typical MOS varactor implementation of a MOS capacitor 312 having a source 322 and a drain 324 that are connected together through vias or other interconnects at a node 325 to one side of an interdigitated finger MOM capacitor 314. The node 325 corresponds to connection 318 in FIG. 3B. The gate 326 is connected through vias or other interconnects at a node 327 to the other side of the interdigitated finger MOM capacitor 314. The node 327 corresponds to connection 319 in FIG. 3B.

FIG. 3D is a two-dimensional side view 330 showing an exemplary embodiment of the stackcap of FIGS. 3B and 3C. In FIG. 3D, an integrated circuit structure 332 is shown having a plurality of layers. In an embodiment, the integrated circuit structure 332 may comprise a silicon die or other multi-layer structure or wafer on which circuit elements can be fabricated. The integrated circuit structure 332 comprises many different power, ground, circuit, metal, dielectric, and other layers, with metal layers m1-mx 334 and an active layer 336 shown for illustrative purposes only. More or fewer than four metal layers 334 can be included, and the active layer 336 may comprise one or more material layers, where the "x" in the designation mx refers to an integer number.

In an exemplary embodiment, the MOS capacitance 312 is fabricated in the active layers 336 and the MOM capacitance 314 is fabricated in one or more of the metal layers 334, such that the stackcap 315 is formed with the MOM capacitance 314 located above the MOS capacitance 312.

FIG. 3E is a schematic diagram illustrating an exemplary embodiment of a MOS varactor. In an exemplary embodiment, the MOS device 350 is an accumulation-mode MOS varactor having a gate 326, drain 324, and source 322. The drain 324 and source 322 of the MOS device 350 are connected together via the node 356 such that the MOS capacitance is formed between the two terminals 352 and 356.

FIG. 4A is a graphical illustration 400 showing the capacitance of a stackcap in accordance with exemplary techniques of the present disclosure. The horizontal axis 402 represents voltage and the vertical axis 404 represents capacitance. The trace 409 represents the performance of the stackcap shown in FIG. 3A. The trace 403 shows the performance of an exemplary embodiment of a stackcap. As shown in FIG. 4A, the trace 403 shows a significantly more linear response from −1V to 1V compared to the trace 409.

FIG. 4B is a schematic diagram 410 illustrating an exemplary embodiment of a stacked capacitor. A first stackcap 415 comprises a MOS capacitance 412 and a MOM capacitance 414. A second stackcap 425 comprises a MOS capacitance 422 and a MOM capacitance 424. In an exemplary embodiment, the MOS capacitance 412 and the MOS capacitance 422 are implemented as MOS varactors. The first stackcap 415 is coupled in series with the second stackcap 425 in what is referred to as a back-to-back configuration at a common node 413. In an exemplary embodiment, the MOM capacitances 414 and 424 are connected in series and are connected to the node 413.

The term back-to-back is intended to imply that the first stackcap 415 and the second stackcap 425 are symmetrically arranged about the common node 413 such that the drain and source contacts of the MOS varactor used to implement the MOS capacitance 412 and the MOS varactor used to implement the MOS capacitance 422 are coupled to the node 413, while the gate contacts of the MOS varactor used to implement the capacitance 412 and the MOS varactor used to implement the MOS capacitance 422 are connected to Vin or Vout. In an exemplary embodiment, the gate contact of the MOS varactor used to implement the MOS capacitance 412 is coupled to Vin and the gate contact of the MOS varactor used to implement the MOS capacitance 422 is coupled to Vout.

A resistance sufficiently large to not disturb the operation of the stackcap 415 and the stackcap 425 in its application, such as in the baseband filter 210 (FIG. 2), Rb 416, is coupled between the node 413 and a bias voltage Vb at connection 417. It is desirable that the voltage difference between Vin on connection 418 or Vout on connection 419 and Vb be non-zero to ensure that a bias voltage is applied to both the first stackcap 415 and the second stackcap 425 to place the first stackcap 415 and the second stackcap 425 in a more linear region similar to the region 405 and similar to the trace 403 (FIG. 4A).

FIG. 4C is a schematic diagram 430 showing an exemplary embodiment of the stacked capacitor of FIG. 4B. In FIG. 4C, an integrated circuit structure 432 is shown having a plurality of layers. In an embodiment, the integrated circuit structure 432 may comprise a silicon die or other multi-layer structure or wafer on which circuit elements can be fabricated. The integrated circuit structure 432 comprises many different power, ground, circuit, metal, dielectric, and other layers, with metal layers m1-mx 434 and an active layer 436 shown for illustrative purposes only. More or fewer than four metal layers 434 can be included, and the active layer 436 may comprise one or more material layers, where the "x" in the designation mx refers to an integer number.

In an exemplary embodiment, the MOS capacitances 412 and 422 are fabricated in the active layer 436 and the MOM capacitances 414 and 424 are fabricated in one or more of the metal layers 434. In this exemplary embodiment, the MOS capacitances are coupled in series in what is referred to as a "back-to-back" orientation, in which either the gates or sources/drains of the MOS capacitances are connected to a common point (such as the node 413 described above). In this exemplary embodiment, the MOM capacitances are coupled in series in the back-to-back configuration.

In an exemplary embodiment, MOS capacitors 412 and 422 can be used alone (without MOM capacitors 414 and 424) in place of the stackcap of FIG. 4B and FIG. 4C to provide a linearized MOS capacitor.

Figures 5A, 5B, 5C:
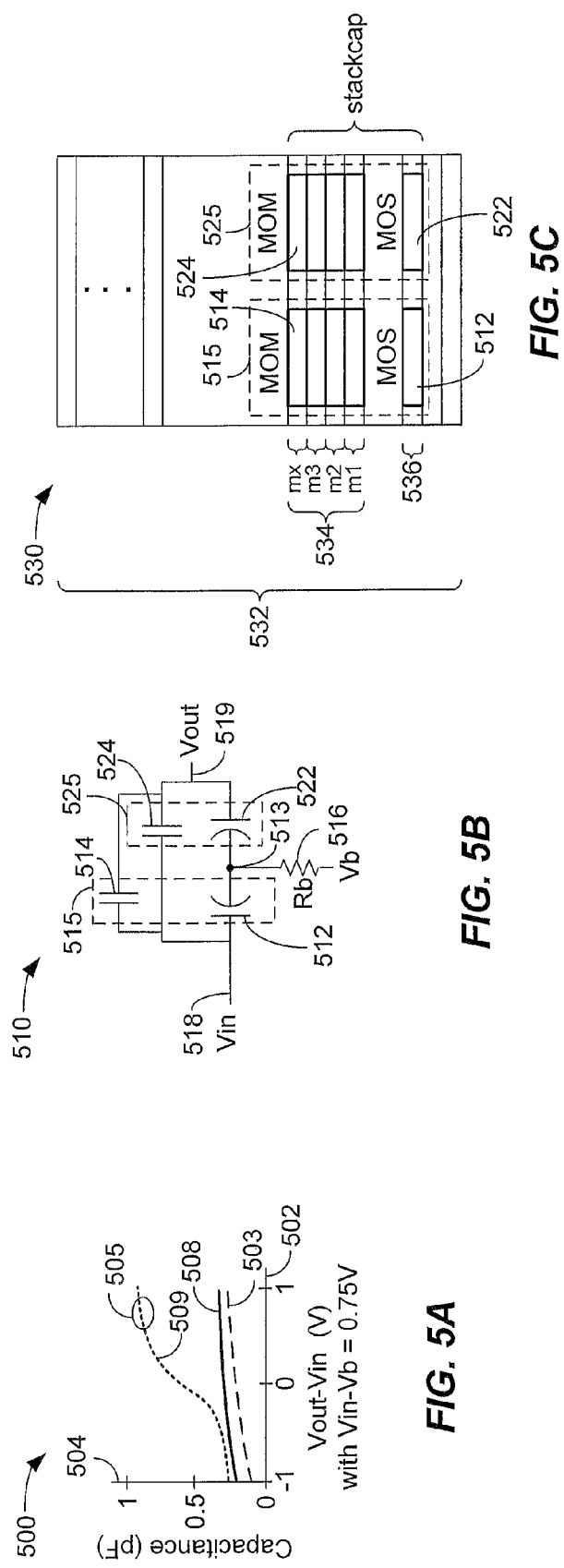
FIG. 5A is a graphical illustration showing the capacitance of a stackcap in accordance with exemplary techniques of the present disclosure.
FIG. 5B is a schematic diagram illustrating an alternative exemplary embodiment of a stacked capacitor.
FIG. 5C is a schematic diagram showing an exemplary embodiment of the stacked capacitor architecture of FIG. 5B.

FIG. 5A is a graphical illustration 500 showing the capacitance of a stackcap in accordance with exemplary techniques of the present disclosure. The horizontal axis 502 represents voltage and the vertical axis 504 represents capacitance. The trace 509 represents the performance of the stackcap shown in FIG. 3A. The trace 503 represents the performance of the stackcap shown in FIG. 4A. The trace 508 shows the performance of another exemplary embodiment of a stackcap. As shown in FIG. 5A, the trace 508 shows an improvement in capacitance compared to the trace 503.

FIG. 5B is a schematic diagram 510 illustrating an alternative exemplary embodiment of a stacked capacitor architecture. A first stackcap 515 comprises a MOS capacitance 512 and a MOM capacitance 514. A second stackcap 525 comprises a MOS capacitance 522 and a MOM capacitance 524. In an exemplary embodiment, the MOS capacitance 412 and the MOS capacitance 422 are implemented as MOS varactors. The first stackcap 515 is coupled in series with the second stackcap 525 in what is referred to as a back-to-back configuration at a common node 513, as described herein.

The first MOM capacitance 514 and the second MOM capacitance 524 are coupled in parallel with each other and in parallel with the series coupled first MOS capacitance 512 and second MOS capacitance 522.

A resistance sufficiently large to not disturb the operation of the stackcap 515 and the stackcap 525 in its application, such as in the baseband filter 210 (FIG. 2), Rb 516, is coupled between the node 513 and a bias voltage Vb to ensure that a non-zero bias voltage, such as Vin-Vb or Vout-Vb, is applied to both the first MOS capacitance 512 and the second MOS capacitance 522 at node 513 such that their region of operation is similar to the region 505 in FIG. 5A.

FIG. 5C is a schematic diagram 530 showing an exemplary embodiment of the stackcaps of FIG. 5B. In FIG. 5C, an integrated circuit structure 532 is shown having a plurality of layers. In an embodiment, the integrated circuit structure 532 may comprise a silicon die or other multi-layer structure or wafer on which circuit elements can be fabricated. The integrated circuit structure 532 comprises many different power, ground, circuit, metal, dielectric, and other layers, with metal layers 534 and an active layer 536 shown for illustrative purposes only. More or fewer than four metal layers 534 can be included, and the active layer 536 may comprise one or more material layers.

In an exemplary embodiment, the MOS capacitances 512 and 522 are fabricated in the active layer 536 and the MOM capacitances 514 and 524 are fabricated in one or more of the four metal layers 534. In this exemplary embodiment, the MOS capacitances 512 and 522 are coupled in series in what is referred to as a "back-to-back" orientation, in which either the gates or the sources/drains of the MOS capacitances are connected to a common point (such as the node 513 described above). In this exemplary embodiment, the MOM capacitances 514 and 524 are coupled in parallel.

Figure 6C:
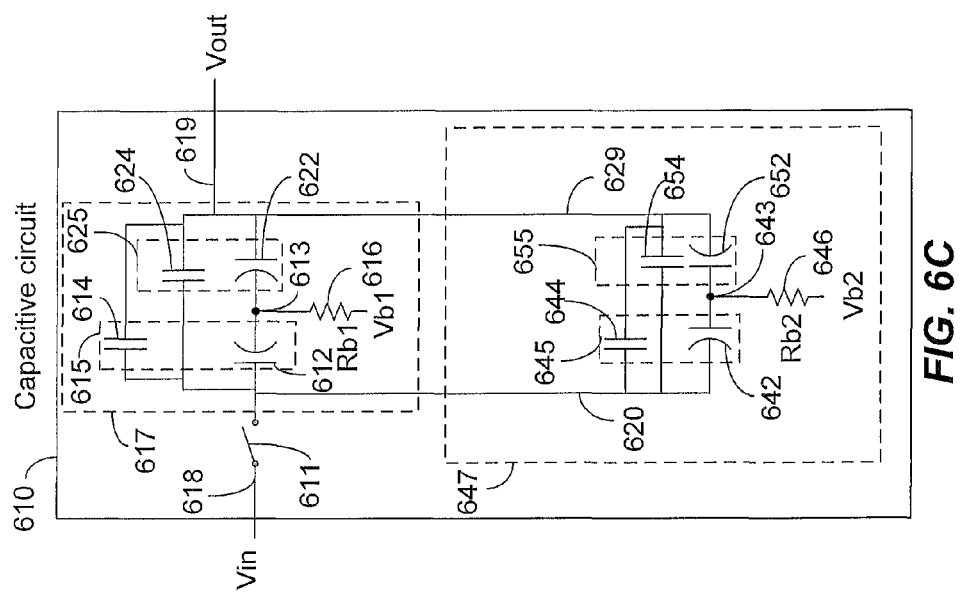
FIG. 6C is a schematic diagram illustrating another exemplary embodiment of a stacked capacitor architecture.
Figure 6B:
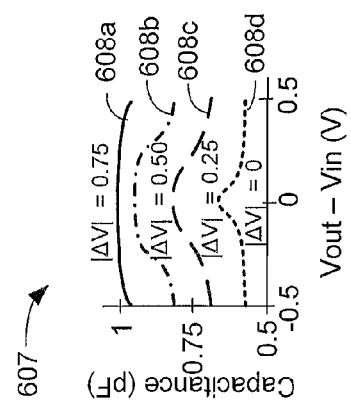
FIG. 6B is a graphical illustration showing four examples of capacitance over a range of voltage drop $|\Delta V|$ for a capacitive circuit at four different bias voltage points.
Figure 6A:
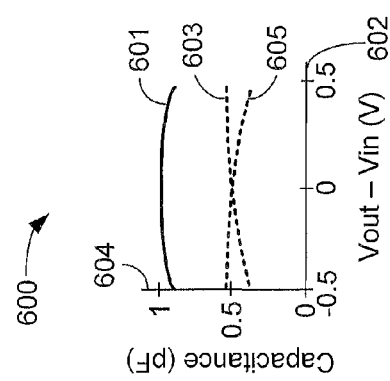
FIG. 6A is a graphical illustration showing the individual and sum capacitance over voltage for a stackcap capacitive circuit in accordance with exemplary techniques of the present disclosure.

FIG. 6A is a graphical illustration 600 showing the individual and sum capacitance over voltage for a stackcap capacitive circuit in accordance with exemplary techniques of the present disclosure. The horizontal axis 602 represents a voltage drop across a stackcap capacitive circuit and the vertical axis 604 represents capacitance. The trace 603 represents a first bias voltage, Vb1, applied to a first stackcap circuit and the trace 605 represents a second bias voltage, Vb2, applied to a second stackcap circuit. In an exemplary embodiment, the difference in bias voltages Vin-Vb1 is opposite in polarity to the difference in bias voltage Vin-Vb2; likewise, Vout-Vb1 is opposite in polarity to Vout-Vb2.

FIG. 6B is a graphical illustration 600 showing four examples of capacitance over a range of voltage drop |ΔV| for a capacitive circuit at four different bias voltage points. In an exemplary embodiment, |ΔV|=|Vin-Vb1|=|Vin-Vb2|. The trace 608a shows capacitance with a bias voltage |ΔV| of 0.75V; the trace 608b shows capacitance with a bias voltage |ΔV| of 0.5V; the trace 608c shows capacitance with a bias voltage |ΔV| of 0.25V; and the trace 608d shows capacitance with a bias voltage |ΔV| of 0V. The choice of bias point affects both the linearity of the overall capacitive circuit as well as the effective capacitance.

FIG. 6C is a schematic diagram illustrating another exemplary embodiment of a stacked capacitor architecture. In an exemplary embodiment, the stacked capacitor architecture shown in FIG. 6C comprises an exemplary embodiment of a capacitive circuit 610. The capacitive circuit 610 comprises a first stackcap unit cell 617 comprising stackcap 615 and stackcap 625. The stackcap 615 comprises a MOS capacitance 612 and a MOM capacitance 614. The stackcap 625 comprises a MOS capacitance 622 and a MOM capacitance 624. The MOS capacitance 612 is coupled in series to the MOS capacitance 622 in what is referred to as a back-to-back configuration at a common node 613. The MOM capacitance 614 and the MOM capacitance 624 are coupled in parallel with each other and in parallel with the series coupled MOS capacitance 612 and MOS capacitance 622. Alternatively, the MOM capacitance 614 and the MOM capacitance 624 can be coupled in series in a configuration similar to the configuration shown in FIG. 4B. A relatively large resistance, Rb1 616, is coupled between the node 613 and a bias voltage Vb1 to ensure that a non-zero bias voltage, such as Vin-Vb1 or Vout-Vb1, is applied to both the MOS capacitance 612 and the MOS capacitance 622 at node 613 such that their region of operation is similar to the region 505 and the trace 508 in FIG. 5A.

The capacitive circuit 610 also comprises a second stackcap unit cell 647 comprising stackcap 645 and stackcap 655. The stackcap 645 comprises a MOS capacitance 642 and a MOM capacitance 644. The stackcap 655 comprises a MOS capacitance 652 and a MOM capacitance 654. The MOS capacitance 642 is coupled in series to the MOS capacitance 652 in what is referred to as a back-to-back configuration at a common node 643. However, the orientation of the MOS capacitances 642 and 652 with respect to the common node 643 are reversed with respect to the orientation of the MOS capacitances 612 and 622 with respect to the common node 613. For example, the MOS capacitances 642 and 652 have their gate contacts coupled to the node 643, whereas the MOS capacitances 612 and 622 have their source/drain contacts coupled to the node 613.

The MOM capacitance 644 and the MOM capacitance 654 are coupled in parallel with each other and in parallel with the series coupled MOS capacitance 642 and MOS capacitance 652. Alternatively, the MOM capacitance 644 and the MOM capacitance 654 can be coupled in series in a configuration similar to the configuration shown in FIG. 4B. A relatively large resistance, Rb2 646, is coupled between the node 643 and a bias voltage Vb2 to ensure that a non-zero bias voltage, such as Vin-Vb2 or Vout-Vb2, is applied to both the MOS capacitance 642 and the MOS capacitance 652 at node 643 such that their region of operation is similar to the region 505 and the trace 508 in FIG. 5A.

A switch 611 can selectively enable usage of the MOS capacitances 612 and 622; and can selectively enable usage of the MOM capacitances 614 and 624 in respective stackcaps 615 and 625. Similarly, the switch 611 can selectively enable usage of the MOS capacitances 642 and 652; and can selectively enable usage of the MOM capacitances 644 and 654 in respective stackcaps 645 and 655. In an exemplary embodiment, the switch 611 can be controlled by a signal from the data processor 110 (FIG. 1). In an exemplary embodiment, the switch 611 may comprise one or more switches or switch networks that can independently control the MOS capacitances 612 and 622 and the MOM capacitances 614 and 624 in respective stackcaps 615 and 625; and the MOS capacitances 642 and 652, and the MOM capacitances 644 and 654 in respective stackcaps 645 and 655 to compensate for process, voltage, and temperature variations in the MOS capacitances and the MOM capacitances.

In an exemplary embodiment, the values of the MOS capacitance 642 and the MOS capacitance 652 in the second stackcap unit cell 617 can be different than the values of the MOS capacitances in the first stackcap unit cell 617. In an exemplary embodiment, the resistance 646 can be the same or a different value than the resistances Rb1.

The stackcaps 615 and 625 are biased such that the MOS capacitances 612 and 622 are placed in a linear operating region such as region 505 shown in FIG. 5A. Because the polarity (Vin-Vb1, Vin-Vb2) and capacitor orientation is opposite, the capacitance of stackcap 615 can be represented by curve 603 in FIG. 6A with increasing capacitance versus Vout-Vin, and stackcap 625 with opposite orientation can be represented by curve 605 in FIG. 6A with decreasing capacitance versus Vout-Vin. The total capacitance of the unit cell 617 is linearized as a result of both the more linear bias points of stackcaps 615 and 625 and the increasing/decreasing capacitance versus Vout-Vin offsetting each other. The stackcaps 645 and 655 are similarly affected.

Figure 7:
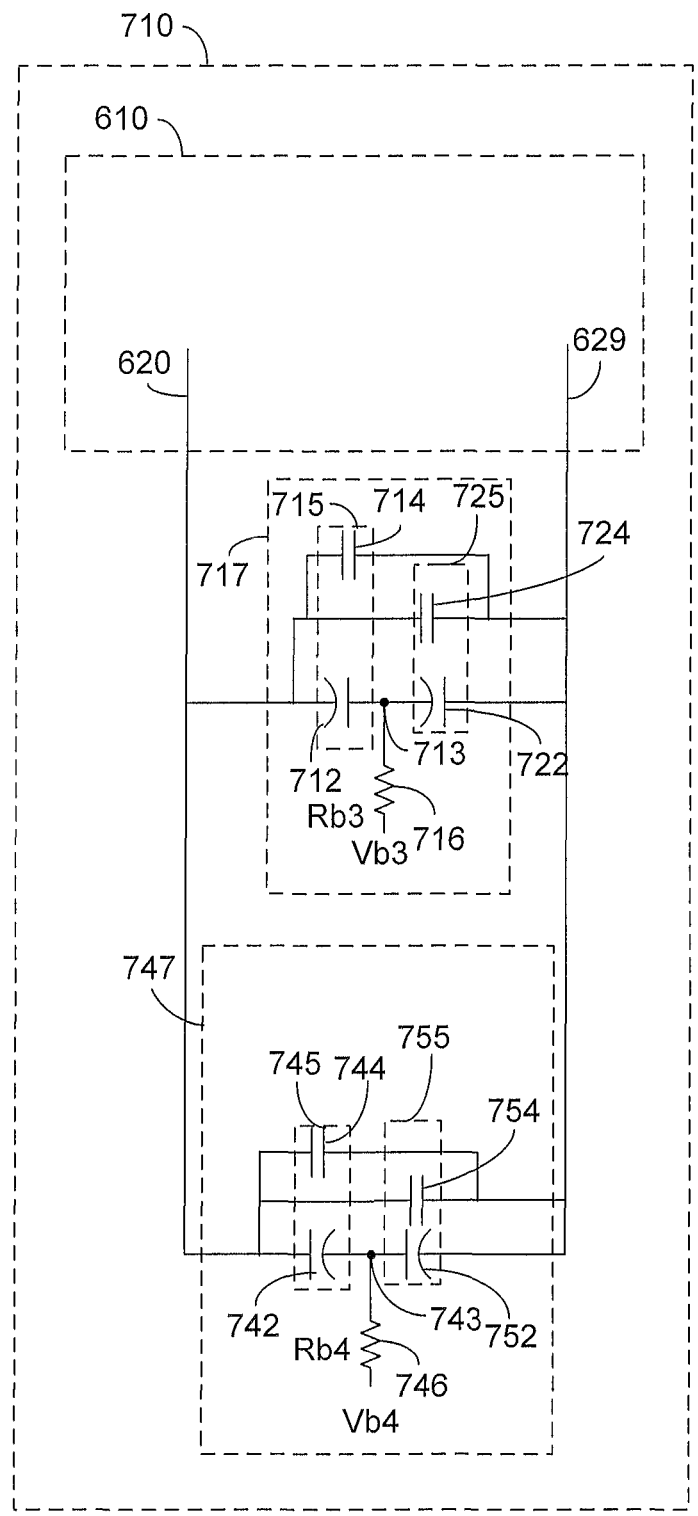
FIG. 7 is a schematic diagram illustrating another exemplary embodiment of a stacked capacitor architecture.

FIG. 7 is a schematic diagram illustrating another exemplary embodiment of a stacked capacitor architecture. In an exemplary embodiment, the stacked capacitor architecture shown in FIG. 7 comprises an exemplary embodiment of a capacitive circuit 710. The capacitive circuit 710 may include the capacitive circuit 610 described above and may include additional stackcap capacitance branches to which different bias voltages can be applied. In an exemplary embodiment, the capacitive circuit 710 comprises a third stackcap unit cell 717 comprising stackcap 715 and stackcap 725. The stackcap 715 comprises a MOS capacitance 712 and a MOM capacitance 714. The stackcap 725 comprises a MOS capacitance 722 and a MOM capacitance 724. The MOS capacitance 712 is coupled in series to the MOS capacitance 722 in what is referred to as a back-to-back configuration at a common node 713. The orientation of the MOS capacitance 712 with respect to the common node 713 is reversed with respect to the orientation of the MOS capacitance 612 with respect to the common node 613. For example, the MOS capacitance 712 has its gate contact coupled to the node 713, whereas the MOS capacitance 612 has its source/drain contacts coupled to the node 613.

The MOM capacitance 714 and the MOM capacitance 724 are coupled in parallel with each other and in parallel with the series coupled MOS capacitance 712 and MOS capacitance 722. Alternatively, the MOM capacitance 714 and the MOM capacitance 724 can be coupled in series in a configuration similar to the configuration shown in FIG. 4B. A relatively large resistance, Rb3 716, is coupled between the node 713 and a bias voltage Vb3 to ensure that a non-zero bias voltage, such as Vin-Vb3 or Vout-Vb3, is applied to both the MOS capacitance 712 and the MOS capacitance 722 at node 713 such that their region of operation is similar to the region 505 and the trace 508 in FIG. 5A.

In an exemplary embodiment, the values of the MOS capacitance 712 and the MOS capacitance 722 in the third stackcap unit cell 717 can be different than the values of the MOS capacitances in the first stackcap unit cell 617 and second stackcap unit cell 647. In an exemplary embodiment, the resistance 716 can be the same or a different value than the resistances Rb1 and Rb2, and the bias voltage Vb3 can be the same or can be different than the bias voltages Vb1 and Vb2, and, in an exemplary embodiment, can be negative while the voltages Vb1 and Vb2 are positive and negative, respectively.

The capacitive circuit 710 also comprises a fourth stackcap unit cell 747 comprising stackcap 745 and stackcap 755. The stackcap 745 comprises a MOS capacitance 742 and a MOM capacitance 744. The stackcap 755 comprises a MOS capacitance 752 and a MOM capacitance 754. The MOS capacitance 742 is coupled in series to the MOS capacitance 752 in what is referred to as a back-to-back configuration at a common node 743. The polarity of the MOS capacitance 752 with respect to the common node 743 is reversed with respect to the polarity of the MOS capacitance 622 with respect to the common node 613. For example, the MOS capacitance 752 has its gate contact coupled to the node 743, whereas the MOS capacitance 622 has its source/drain contacts coupled to the node 613. Moreover, the gate contact of the MOS capacitance 712 and the source/drain contacts of the MOS capacitance 722 are coupled to the node 713; and the source/drain contacts of the MOS capacitance 742 and the gate contact of the MOS capacitance 752 are coupled to the node 743.

The MOM capacitance 744 and the MOM capacitance 754 are coupled in parallel with each other and in parallel with the series coupled MOS capacitance 742 and MOS capacitance 752. Alternatively, the MOM capacitance 744 and the MOM capacitance 754 can be coupled in series in a configuration similar to the configuration shown in FIG. 4B. A relatively large resistance, Rb4 746, is coupled between the node 743 and a bias voltage Vb4 to ensure that a non-zero bias voltage, such as Vin-Vb4 or Vout-Vb4, is applied to both the MOS capacitance 742 and the MOS capacitance 752 at node 743 such that their region of operation is similar to the region 505 and the trace 508 in FIG. 5A.

In an exemplary embodiment, the values of the MOS capacitance 742 and the MOS capacitance 752 in the fourth stackcap unit cell 747 can be different than the values of the MOS capacitances in the first stackcap unit cell 617, second stackcap unit cell 647, and third stackcap unit cell 717. In an exemplary embodiment, the resistance 746 can be the same or a different value than the resistances Rb1, Rb2 and Rb3, and the bias voltage Vb4 can be the same or can be different than the bias voltages Vb1, Vb2 and Vb3, and can be positive or negative.

Figure 8:
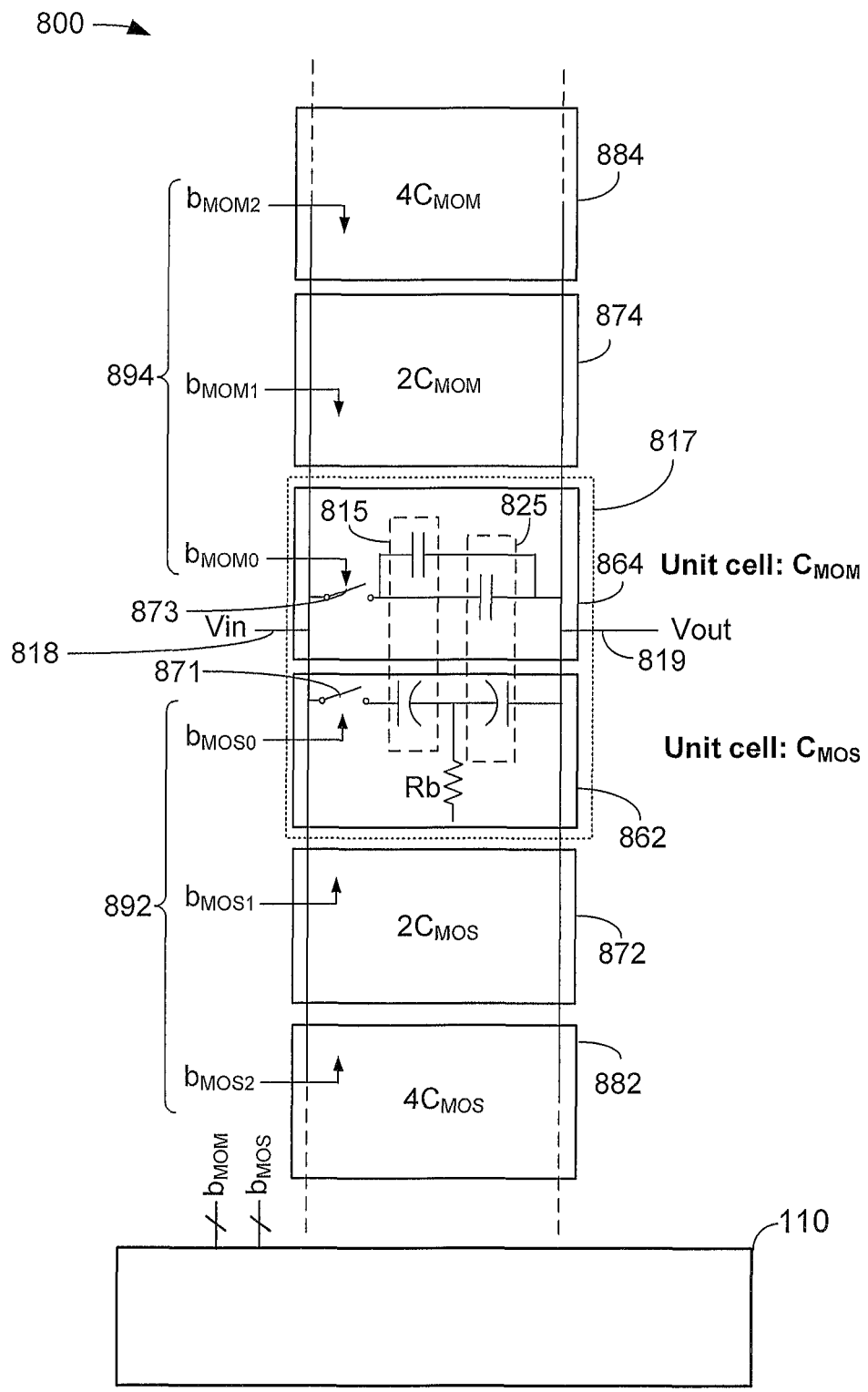
FIG. 8 is a schematic diagram illustrating a switched capacitive circuit.

FIG. 8 is a schematic view illustrating an example of a switched capacitive circuit 800. In an exemplary embodiment, the switched capacitive circuit 800 comprises a stackcap unit cell 817. The stackcap unit cell 817 is similar to the stackcap unit cell 617 and comprises stackcap 815 and stackcap 825, which are similar to the stackcaps 615 and 625, respectively, of FIG. 6. The stackcap unit cell 817 comprises a MOS capacitance unit cell 862 comprising the MOS capacitances of the stackcap 815 and the stackcap 825, and a MOM capacitance unit cell 864 comprising the MOM capacitances of the stackcap 815 and stackcap 825. Other details of the stackcap unit cell 817 are omitted for simplicity. In the exemplary embodiment of FIG. 8, the MOS capacitance unit cell 862 comprises a first switch 871 coupled to a Vin connection 818 and the MOM capacitance unit cell 864 comprises a second switch 873 coupled to the Vin connection 818. The output, Vout, of the MOS capacitance unit cell 862 and the MOM capacitance unit cell 864 is provided over connection 819. Independently switching the MOS capacitance unit cell 862 and the MOM capacitance unit cell 864 allows independent selection of none, either, or both of the MOS and MOM capacitors in the stackcap unit cell 817.

In an exemplary embodiment, the MOS capacitance unit cell 862 comprises a first characteristic capacitance, $C_{MOS}$. A second MOS capacitance unit cell 872 comprises a second characteristic capacitance, $2C_{MOS}$; and a third MOS capacitance unit cell 882 comprises a third characteristic capacitance, $4C_{MOS}$. The second MOS capacitance unit cell 872 and the third MOS capacitance unit cell 882 are similar to the MOS capacitance unit cell 862, but include progressively more MOS capacitance. For example, the second MOS capacitance unit cell 872 can be configured to provide two times the MOS capacitance as the MOS capacitance unit cell 862 and the third MOS capacitance unit cell 882 can be configured to provide four times the MOS capacitance as the MOS capacitance unit cell 862. Moreover, additional MOS capacitance unit cells can be added to provide any amount of additional MOS capacitance.

In an exemplary embodiment, the switch 871 can be implemented in a variety of ways using a variety of switching technologies, and, in an exemplary embodiment, can be implemented as a one or more pole, and a one or more throw switch, depending on the implementation. In an exemplary embodiment, each of the MOS capacitance unit cells 872 and 882 can be switched similar to the MOS capacitance unit cell 862. In an exemplary embodiment, a multiple bit control signal "$b_{MOS}$" having a number of control bits equal to the number of MOS capacitance unit cells, which in this example comprises $b_{MOS}$, $b_{MOS1}$ and $b_{MOS2}$, can be provided by, for example, the data processor 110 of FIG. 1, such that the total MOS capacitance is the result of a digitally controlled binary weighted MOS capacitor bank 892 comprising, in an exemplary embodiment, the MOS capacitance unit cell 862, the second MOS capacitance unit cell 872, and the third MOS capacitance unit cell 882. Alternatively, any arbitrary weighting can be used to control the amount of MOS capacitance.

In an exemplary embodiment, the MOM capacitance unit cell 864 comprises a first characteristic capacitance, $C_{MOM}$. A second MOM capacitance unit cell 874 comprises a second characteristic capacitance, $2C_{MOM}$; and a third MOM capacitance unit cell 884 comprises a third characteristic capacitance, $4C_{MOM}$. The second MOM capacitance unit cell 874 and the third MOM capacitance unit cell 884 are similar to the MOM capacitance unit cell 864, but include progressively more MOM capacitance. For example, the second MOM capacitance unit cell 874 can be configured to provide two times the MOM capacitance as the MOM capacitance unit cell 864 and the third MOM capacitance unit cell 884 can be configured to provide four times the MOM capacitance as the MOM capacitance unit cell 864. Moreover, additional MOM capacitance unit cells can be added to provide any amount of additional MOM capacitance, and the number of MOM capacitance unit cells need not be the same as the number of MOS capacitance unit cells.

In an exemplary embodiment, the switch 873 can be implemented in a variety of ways using a variety of switching technologies, and, in an exemplary embodiment, can be implemented as a one or more pole, and a one or more throw switch, depending on the implementation. In an exemplary embodiment, each of the MOM capacitance unit cells 874 and 884 can be switched similar to the MOM capacitance unit cell 864. In an exemplary embodiment, a multiple bit control signal "$b_{MOM}$" having a number of control bits equal to the number of MOM capacitance unit cells, which in this example comprises $b_{MOM0}$, $b_{MOM1}$ and $b_{MOM2}$, can be provided by, for example, the data processor 110 of FIG. 1, such that the total MOM capacitance is the result of a digitally controlled binary weighted MOM capacitor bank 894 comprising, in an exemplary embodiment, the MOM capacitance unit cell 864, the second MOM capacitance unit cell 874, and the third MOM capacitance unit cell 884. In the same fashion, the MOS capacitor back can be controlled by $b_{MOS0}$, $b_{MOS1}$, $b_{MOS2}$, for the binary-weighted MOS capacitor bank 892. Alternatively, any arbitrary weighting can be used for the MOM 894 and MOS 892 capacitor banks.

By independently selecting some, all, or none of the MOM and MOS unit cells 864, 862 and their weighted replicas 874, 884, 872, 882, a wide range of capacitance values can be selected by the digital controls $b_{MOS}$ and $b_{MOM}$. For example, depending on the desired capacitance value and linearity, only MOM capacitors could be selected to attain a smaller total capacitance value with the highest linearity, or both MOM and MOS capacitors could be selected to attain the highest possible capacitance.

Process, voltage, and temperature variations can result in independent variations in capacitance value for the MOS and MOM capacitors as their physical implementations are different. In order to adjust the total capacitance to a target value, in an exemplary embodiment the MOM and MOS capacitors can be selected for the signal path independently of each other based on the digital controls provided by, for example, the data processor 110 of FIG. 1. For example, if the effective capacitance after fabrication is less than the desired target value, the digital controls $b_{MOM}$ and $b_{MOS}$ can select more capacitance for the signal path to adjust the effective capacitance to the target value. Any of the combinations of selecting the amount of MOM capacitance, MOS capacitance, or a combination of MOS and MOM capacitance can be used to correct for process, voltage, or temperature variations.

Figure 9:
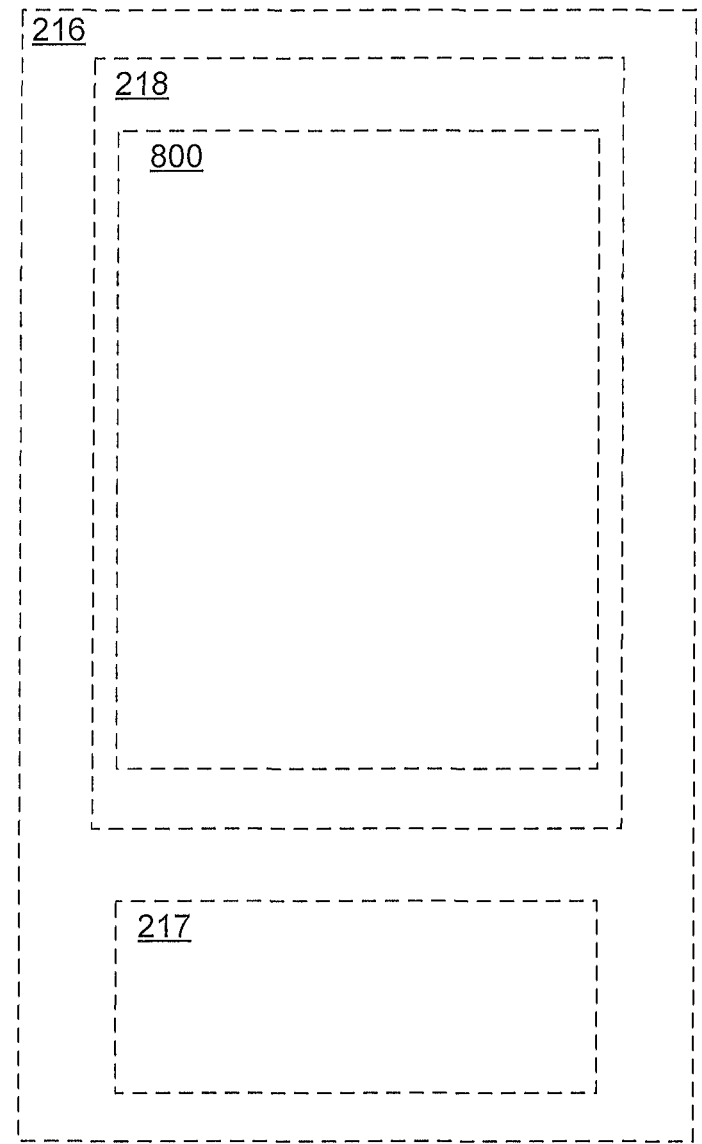
FIG. 9 is a block diagram showing an exemplary embodiment of an implementation of the switched capacitive circuit of FIG. 8 in a feedback network.

FIG. 9 is a block diagram showing an exemplary embodiment of an implementation of the switched capacitive circuit of FIG. 8 in a feedback network. In an exemplary embodiment, the feedback network 216 can be coupled between the output of the filter element 215 on connection 214 and the input to the filter element 215 on connection 212 (FIG. 2). The feedback network 216 can be implemented using any combination of capacitive, resistive and/or inductive elements, and is illustrated herein using an adjustable resistance 217 and an adjustable capacitance 218. The adjustable capacitance 218 may comprise one or more instances of the switched capacitive circuit 800 with any of the possible stackcap configurations 310 (FIG. 3B), 410 (FIG. 4B), 510 (FIG. 5B), 610 (FIG. 6B), or 710 (FIG. 7) in any orientation. The adjustable capacitance 218 can be used to tune a RC pole such as the feedback network 218 in FIG. 2 to a variety of different 3 dB bandwidths using a combination of MOM and MOS capacitors, and can be optimized for linearity or capacitance value by selecting either MOM or MOS or any combination thereof.

Figure 10:
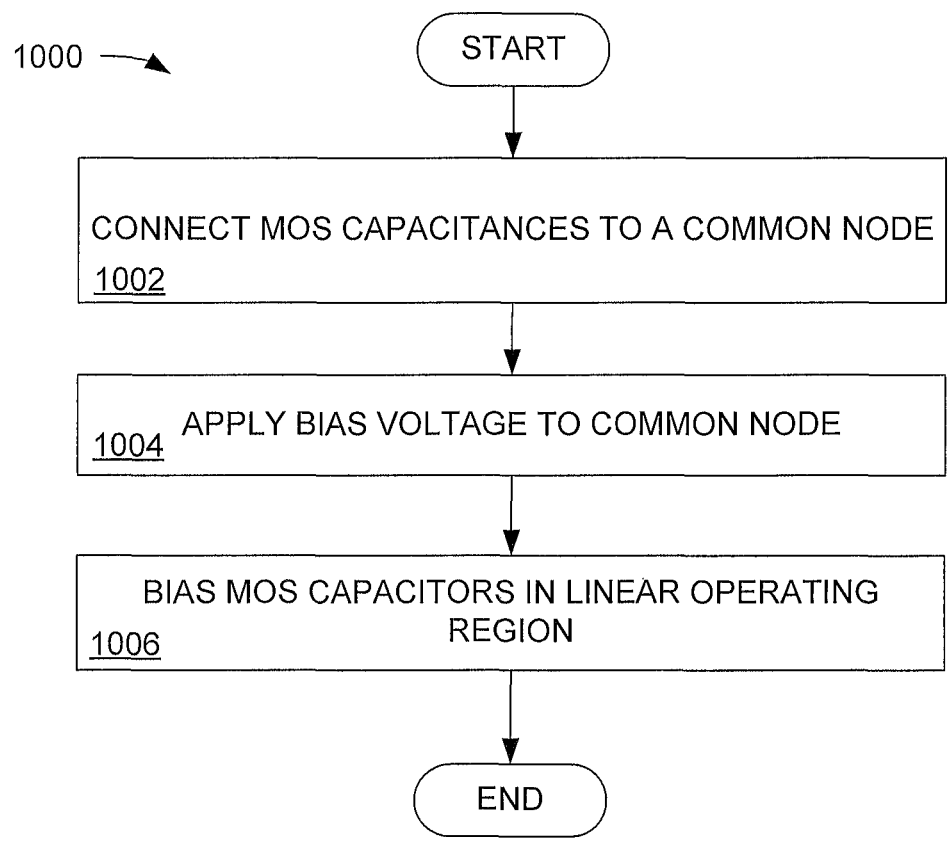
FIG. 10 is a flow chart showing an exemplary embodiment of a method for biasing MOS capacitances in a stacked capacitor architecture.

FIG. 10 is a flow chart showing an exemplary embodiment of a method for biasing MOS capacitances in a stacked capacitor architecture.

In block 1002, MOS capacitances in a stacked capacitor architecture are connected to a common node.

In block 1004, a bias voltage is applied to the common node.

In block 1006, the MOS capacitances are biased to operate in a linear region.

Exemplary embodiments of the architecture implement back-to-back MOS capacitances in a configuration which allows the MOS capacitances to be biased via a resistor without disturbing signal path performance.

In an exemplary embodiment, two MOM capacitances in parallel with the MOS capacitances form a stackcap and provide the maximum amount of capacitance from the MOM cap.

In an exemplary embodiment, biasing the MOS capacitances at a voltage other than zero-bias, improves the linearity and the capacitance density of the MOS capacitances.

In an exemplary embodiment, the MOM capacitances can be controlled independently from the MOS capacitances to provide adjustments for RC tuning or can be implemented independently from the MOS capacitances for improved linearity in modes having higher bandwidth or requiring less capacitance.

The stacked MOS and MOM capacitance architecture described herein may be implemented on one or more ICs, analog ICs, RFICs, mixed-signal ICs, ASICs, printed circuit boards (PCBs), electronic devices, etc. The stacked MOS and MOM capacitance architecture may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the stacked MOS and MOM capacitance architecture described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal.

Although selected aspects have been illustrated and described in detail, it will be understood that various substitutions and alterations may be made therein without departing from the spirit and scope of the present invention, as defined by the following claims.

What is claimed is:
1. A device, comprising:
a first stacked capacitor comprising a first MOS capacitance and a first MOM capacitance, the first MOS capacitance coupled between an input node and a first node, the first node configured to receive a first bias voltage, wherein the first MOS capacitance comprises a first MOS varactor having a source and a drain coupled together; and a second stacked capacitor comprising a second MOS capacitance and a second MOM capacitance, the second MOS capacitance coupled between an output node and the first node, wherein the second MOS capacitance comprises a second MOS varactor having a source and a drain coupled together, and wherein a capacitance of the device is provided between the input node and the output node.

2. The device of claim 1, wherein the first and second MOS capacitances are configured to operate in a linear region responsive to the first bias voltage.

3. The device of claim 1, wherein a capacitance of the first and second MOS capacitances and a capacitance of the first and second MOM capacitances are independently controlled.

4. The device of claim 1, further comprising:

a third stacked capacitor architecture comprising a third MOS capacitance and a third MOM capacitance, the third MOS capacitance coupled between the input node and a second node, the second node configured to receive a second bias voltage; and a fourth stacked capacitor architecture comprising a fourth MOS capacitance and a fourth MOM capacitance, the fourth MOS capacitance coupled between the output node and the second node, where the first node is configured to receive the first bias voltage and the second node is configured to receive a second bias voltage.

5. The device of claim 4, wherein the first bias voltage establishes a non-zero voltage drop across the first MOS capacitance and the second MOS capacitance and the second bias voltage establishes a non-zero voltage drop across the third MOS capacitance and the fourth MOS capacitance.

6. The device of claim 1, wherein the first and second MOS capacitances are coupled in series and the first and second MOM capacitances are coupled in series, and the series coupled MOM capacitances are coupled in parallel with the series-coupled MOS capacitances.

7. The device of claim 1, wherein the first and second MOS capacitances are coupled in series and the first and second MOM capacitances are coupled in parallel, and the parallel coupled MOM capacitances are coupled in parallel with the series-coupled MOS capacitances.

8. The device of claim 1, wherein the first bias voltage establishes a non-zero voltage drop across the first MOS capacitance and the second MOS capacitance.

9. The device of claim 1, wherein a gate of each MOS varactor is coupled to the first node.

10. The device of claim 1, wherein the source and drain of each MOS varactor are coupled to the first node.

11. The device of claim 1, wherein the source and drain of the first MOS varactor are coupled to the first node, and a gate of the second MOS varactor is coupled to the first node.

* * * * *